United States Patent [19]

Guillaume

[11] 4,194,834

[45] Mar. 25, 1980

[54] UNIT FOR REPRODUCING TRANSPARENT ORIGINALS, OR THE LIKE

[75] Inventor: Emile A. H. Guillaume, Ballaigues, Switzerland

[73] Assignee: Zelacolor Systems Establishment, Vaduz, Liechtenstein

[21] Appl. No.: 920,399

[22] Filed: Jun. 29, 1978

Related U.S. Application Data

[62] Division of Ser. No. 746,301, Dec. 1, 1976, Pat. No. 4,110,036.

[30] Foreign Application Priority Data

Dec. 2, 1975 [CH] Switzerland .................. 15625/75

[51] Int. Cl.² ........................................ G03B 27/54
[52] U.S. Cl. ................................ 355/67; 355/32
[58] Field of Search ........................... 355/32, 67

[56] References Cited

U.S. PATENT DOCUMENTS

| | | | |
|---|---|---|---|
| 3,510,220 | 5/1970 | Bures | 355/67 |
| 3,639,054 | 2/1972 | Wally, Jr. | 355/67 X |
| 3,829,210 | 8/1974 | Langer et al. | 355/67 X |
| 3,854,815 | 12/1974 | McIntosh | 355/67 |
| 3,874,792 | 4/1975 | Turner | 355/67 |
| 3,984,849 | 10/1976 | Guillaume | 355/32 X |

*Primary Examiner*—Richard A. Wintercorn
*Attorney, Agent, or Firm*—Ostrolenk, Faber, Gerb & Soffen

[57] ABSTRACT

A compact optical bench type unit for making selected color-component records of color transparencies for use in color printing comprises a light source with a rotary filter disc for directing a beam of selectively colored light through a light condenser which converges the beam through a color diapositive to be reproduced and into the objective of a camera. The condenser, possibly formed of Fresnel lenses, is of large dimensions to accomodate large diapositives, and the camera objective has a relatively short focal length. Chromatic aberration of the condenser is corrected by moving the light source in correspondence with rotation of the filter disc, or by selectively inserting correcting lenses in the beam.

10 Claims, 8 Drawing Figures

UNIT FOR REPRODUCING TRANSPARENT ORIGINALS, OR THE LIKE

This is a division of application Ser. No. 746,301, filed Dec. 1, 1976, now U.S. Pat. No. 4,110,036, issued Aug. 29, 1978.

This invention concerns a unit for reproducing transparent originals, notably for making colour selections, comprising a light generator producing a beam of light directed via a light condenser to a camera, and a carrier for supporting an original in said beam of light.

There are many units for reproducing transparent photographic originals on the market. The invention particularly concerns such units in the form of optical benches used to make colour selections which are then half-toned for reproduction of colour diapositives by printing presses, the reproduction being either quadrichrome (red, green, white and blue components) or trichrome (red, green and blue components). Optical benches used for making colour selections enabling high quality reproduction are large apparatus (on average, 3 meters long) and must generally be located in a dark room. Such optical benches have an optical condenser with a focal length of at least 400 mm and a camera whose objective also has a focal length of 400 mm. These dimensions are necessarily dictated by the dimensions of the originals to be reproduced, namely transparent films of up to 40 cm diagonal.

An aim of the invention is to provide a unit or optical bench for the reproduction of transparent originals which is of substantially smaller dimensions than the comparable known units and which does not have to be placed in a dark room, while having the same refinements and quality of reproduction as the known units or optical benches of greater dimensions.

To offer the same possibilities of use, the unit according to the invention will have an optical condenser with a focal length of about 400 mm, which permits the reproduction of large originals. However, it will be relatively small, i.e. its length need be no greater than 1.20 meter. To enable this, the camera objective will have a focal length of 80 to 100 mm at the most, instead of 400 mm.

To achieve this aim, the unit according to the invention is characterized in that it comprises means for correcting chromatic aberration controlled in relation to changes of colour of the beam emitted by the generator.

In a preferred embodiment of the invention, the means for correcting chromatic aberration comprise a motor arranged to provide a relative movement between the camera and the light generator to make the point of convergence of the beam into the camera coincide with the optical centre of the camera objective. The motor controls movement of the light generator at the same time as a member for positioning filters of different colour in the beam.

The light generator is moved by means of a disc driven by the motor, this disc being connected to the light generator by a crank whose free end is pivotally mounted on a support fixed on at least one horizontal rail on which the light generator can slide, the motor also being connected to the filter-positioning means which is in the form of a filter disc.

Driving of the motor can be controlled by an electric circuit comprising a printed circuit plate having conductive "positioning" area, this plate being placed adjacent the disc which moves the light generator by the crank, a sliding contact turning with this disc coming to contact the conductive areas of the plate to deliver an electric signal to the circuit controlling the motor.

The accompanying drawings show, by way of example, an embodiment of a unit for reproducing transparent originals according to the invention, as well as two variations. In the drawings.

Figure 1:
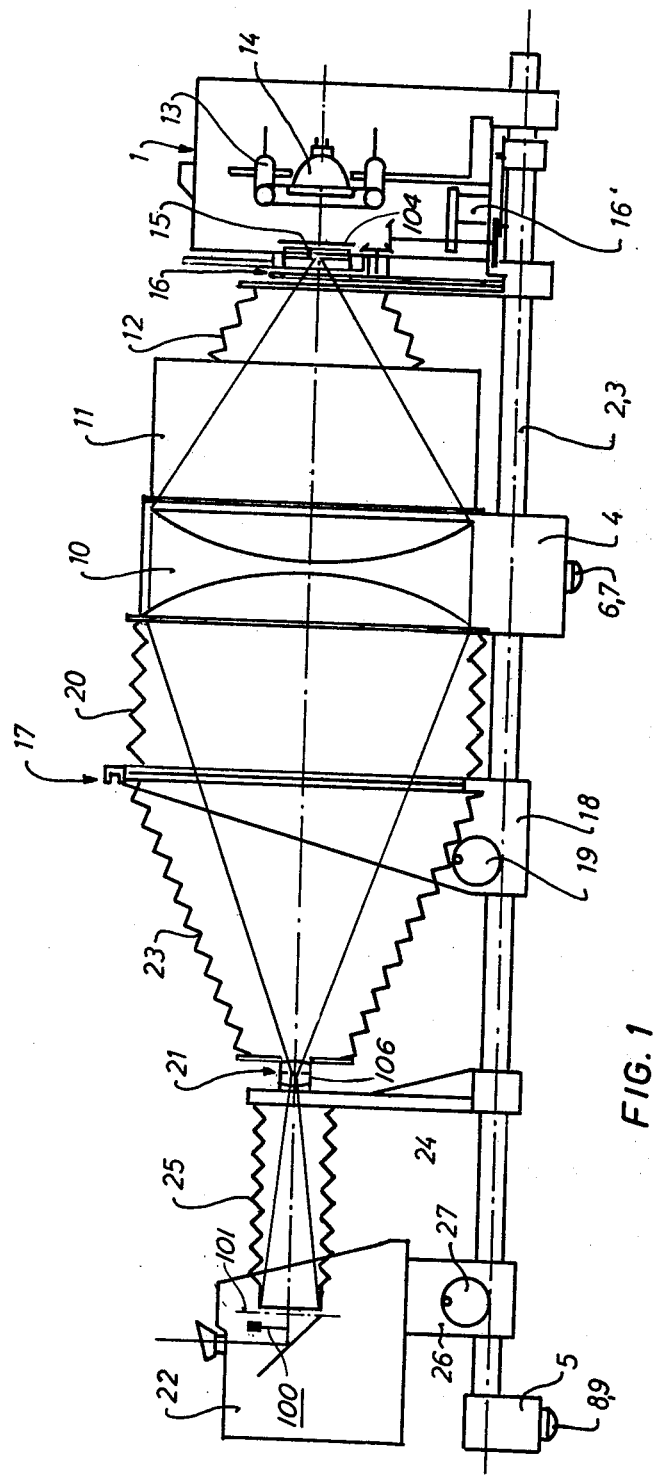
FIG. 1 is a schematic side elevational view of the reproduction unit which is adapted for the taking of colour selections from a colour transparency.

The reproduction unit shown in FIGS. 1 to 6 comprises (FIG. 1) a light-generator chassis 1 arranged to slide on two parallel horizontal guide rails 2, 3 forming an optical bench and united by a chassis 4 of an optical condenser and by an end cross-piece 5. The optical bench of FIG. 1 rests on a working table, not shown, by rubber feet 6, 7 under the chassis 4, and 8, 9 under the crosspiece 5. The upper part of chassis 4 carries an optical condenser 10 having a lens system and a rear light shield 11 in the form of a box which is connected to the light-generator chassis 1 by a bellows 12. The chassis 1, which will be described in detail with reference to FIGS. 3 to 6, carries a discharge tube 13, a setting lamp 14, a diaphragm 15, and a filter disc 16 having a sighting aperture and at least one red, green and blue filter, as well as a motor unit 16' connected to control the filter disc 16 and to move the chassis 1 on the rails 2, 3. Following the optical condenser 10 is placed an original-support 17 mounted on a chassis 18 having a control handle 19 enabling the support 17 to be moved along a rack, not shown, fixed on one of the guide rails 2, 3. The support 17 is connected to one side to the optical condenser 10 by means of a bellows 20 and on its other side to an objective 21 of a still camera 22 by a bellows 23. The objective 21 is fixed on the two rails 2, 3 by a support 24 and is connected to the camera 22 by a bellows 25. Camera 22 is fixed on a support 26 comprising a control handle 27 enabling the camera to be moved along a rack, not shown, fixed on one of the rails 2, 3. The camera 23 is of the type described in Swiss Pat. No. 595,610 and corresponding U.S. Pat. No. 3,984,849, and its objective 21 is a conventional one with an incorporated diaphragm 106 and having a focal length of about 80 mm. The camera 22 is fitted with a photo-electric 100 arranged to be movable to any point of the plane 101 in which the image of the original is formed ("film plane") so that the cell 100 can measure the intensity of the light from the discharge tube 13 at any point of the plane 101 of the image. This brieflydescribed cell is important, as it enables a light setting as will be explained with reference to FIGS. 3 and 4. The camera described in the stated patents is a 6/6 camera adapted to take colour selections and is able to receive correcting masks. However, it is clear that it may be replaced by other known cameras with an appropriate objective.

The optical condenser 10 comprises a lens system with a focal distance of 350 to 400 mm.

The originality of the optical bench of FIG. 1 resides in the fact that an optical condenser 10 having a focal length of 350 to 400 mm is combined with a camera with an objective of 80 mm focal length. This combination is contrary to the practices heretofore followed by persons skilled in the art, but it enables the optical bench to have a length of only 1.25 meters whereas all of the comparable prior-art optical benches have lengths of two meters or more. Although it has a length of only 1.25 meters, the optical bench of FIG. 1 nevertheless enables the reproduction of originals with a diagonal of up to 40 cm with a greater sharpness than that obtained with the conventional optical benches. This performance is enabled thanks to a correction device explained in detail with reference to FIGS. 2 to 4.

Operation of the optical bench of FIG. 1 will be described later.

Figure 2:
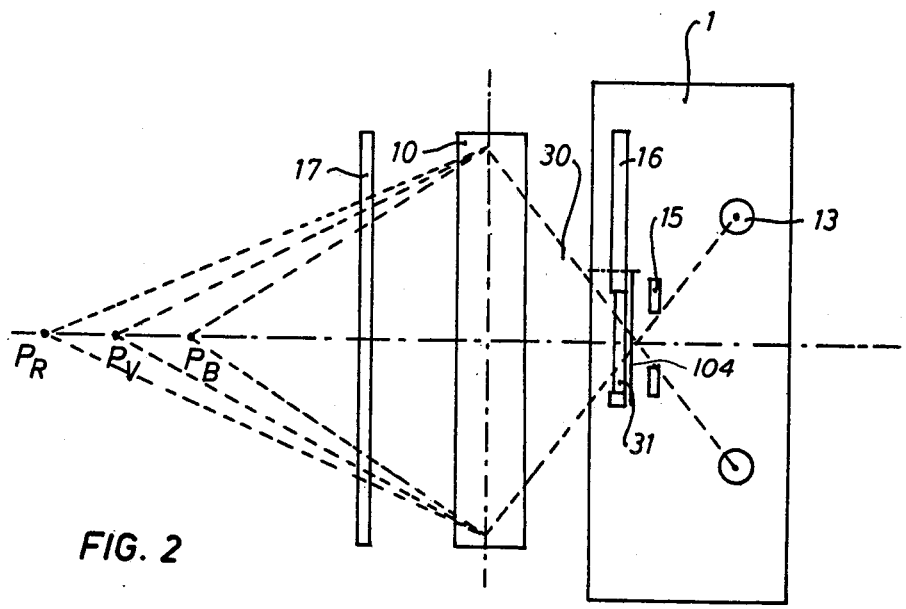
FIG. 2 is a schematic diagram showing the chromatic aberration produced in the diametral plane of the objective in the reproduction unit when blue, green and red filters are placed in the beam of light.

FIG. 2 schematically shows the chassis 1 carrying the discharge tube 13, diaphragm 15 and filter disc 16. A beam of light 30 emitted by tube 13 passes through the diaphragm 15 and a blue filter 31 of filter disc 16 to condenser 10 which focuses it at $P_B$, the converging beam also passing through an original carried by support 17. When the blue filter 31 is replaced respectively by a green filter and a red filter, while maintaining the setting of the optical bench, the beam 30 is focused at points $P_V$ and $P_R$ respectively. In the instance of the 1.25 meter optical bench of FIG. 1, the distances between the points $P_B$, $P_V$ and $P_R$ is of the order of a centimeter. Thus, it is clear that if the optical bench of FIG. 1 is set for white light (which setting corresponds approximately to the setting for green light), the point $P_V$ of FIG. 2 wil be at the focal point of the objective 21 of camera 22 and the image of the green selection in the plane of film in the camera will be sharp. To the contrary, when the blue filter or red filter is used, the point $P_B$ or $P_R$ will not be at the centre of the objective 21 but respectively in front of and behind it. Consequently, the image of the blue or red component will be blurred and will have a lighting fault between the centre and the edges of the image in the film plane of the camera.

The chromatic aberration effect which has just been explained is all the more critical as the focal length of the camera objective decreases. In large installations several meters long, whose camera objective has a focal length of about 400 mm, chromatic aberration is not critical and does not require correction, apart from the usual masking corrections carried out by the operator. To the contrary, in the installation of FIG. 1 with a camera objective of relatively short focal length, a correction is necessary. Persons skilled in the art will realize that the chromatic aberration cannot be corrected by changing the distances between the camera and its objective or between the camera and the optical condenser, since this would alter the dimensions of the colour selections. The applicant thus sought, against the advice of all the experts consulted, to carry out a correction applied to the light source. Tests carried out with a light generator having a control device as shown in FIGS. 3 to 6 have given good results.

Figure 3:
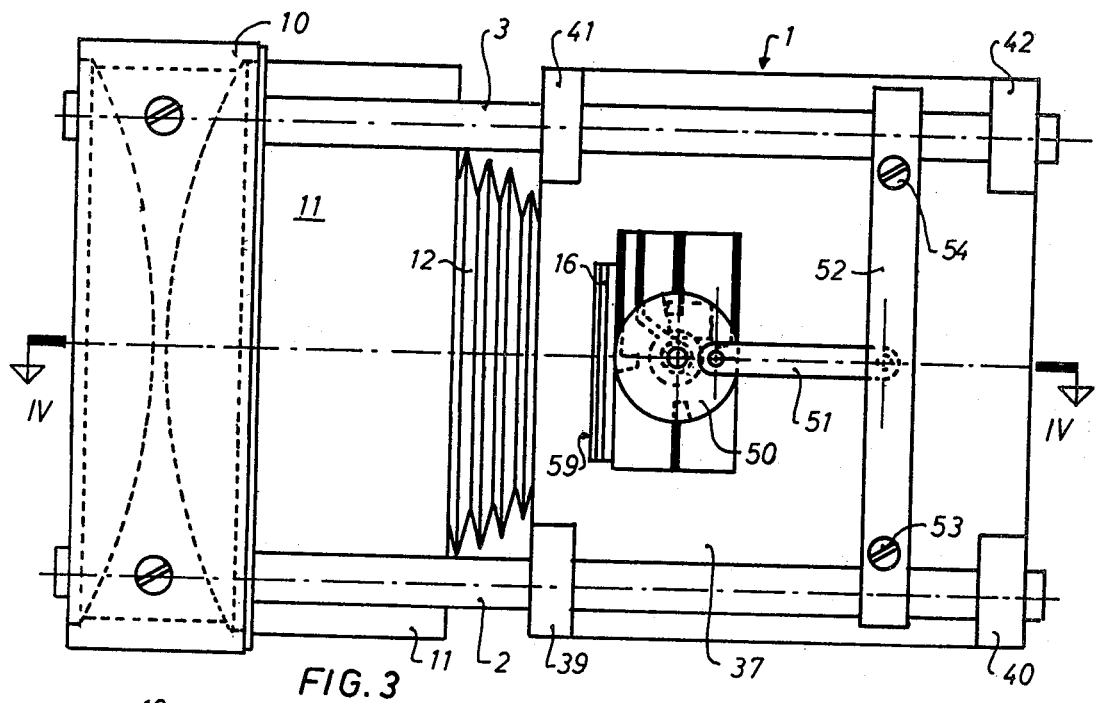
FIG. 3 is an underneath plan view of a sliding chassis carrying the light generator and filters of the unit of FIG. 1.
Figure 4:
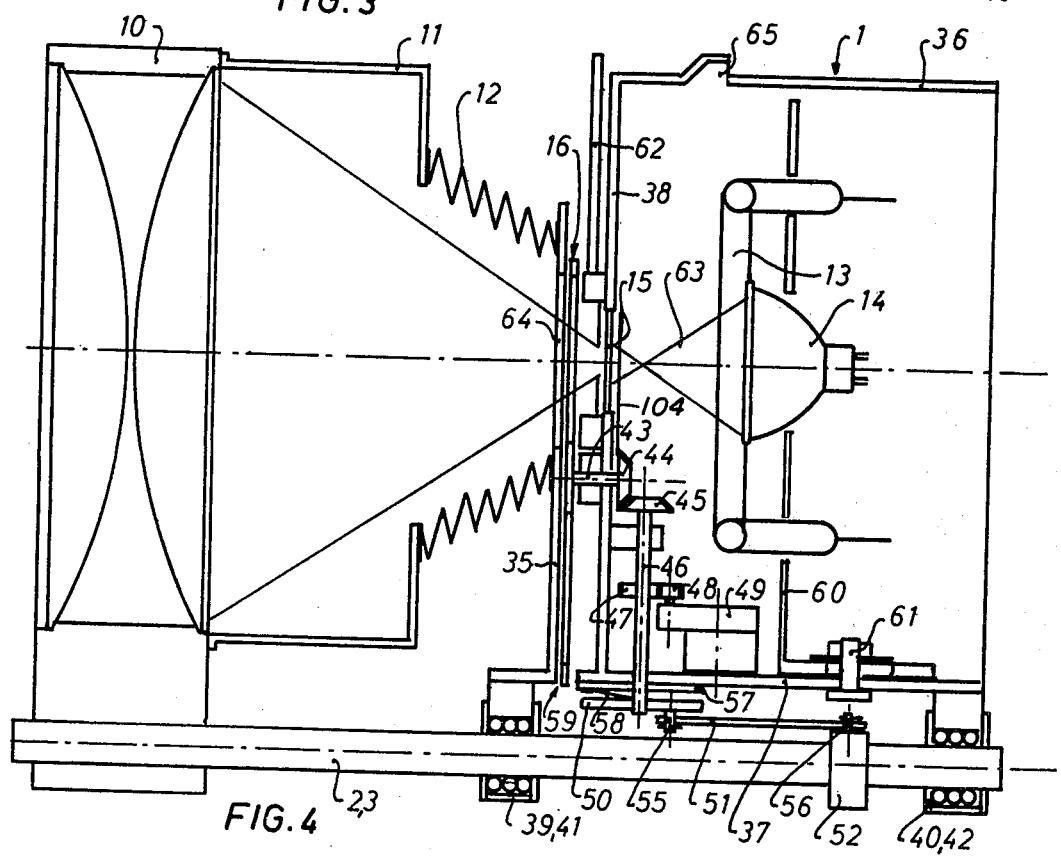
FIG. 4 is a cross-section along line IV—IV of FIG. 3.

FIGS. 3 and 4 show the right-hand part of the optical bench of FIG. 1. The optical condenser 10, mounted on the guide rails 2, 3, has its rear light shield 11 connected by bellows 12 to a front wall 35 (FIG. 4) of the light-generator chassis 1. The light-generator chassis 1 is in the form of a box with upper and lower walls 36, 37 and an intermediate front wall 38. The lower wall 37 is supported by four ball bearings 39, 40, 41 and 42 sliding on the guide rails 2, 3, whereby the light-generator chassis 1 can move along the guide rails 2, 3.

The filter disc 16 comprises a sighting aperture and blue, green and red filters (not shown) equally spaced apart from one another, and is supported on a rotary axle 43 passing through wall 38. At the end of axle 43 is a bevel pinion 44 meshing with a similar pinion 45 fixed at the upper end of a vertical rotary shaft 46. In its middle part, shaft 46 has a toothed wheel 47 meshing with a toothed wheel 48 driven by a motor 49. The lower end of shaft 46 carries a driving disc 50 connected by a pivoted crank 51 to a cross-bar 52 fixed on rails 2, 3 by means of screws 53, 54. The crank 51 is pivotally connected to the disc 50 and cross-bar 52 by respective pins 55, 56. Thus, when the motor 49 is started, the toothed wheel 48 drives shaft 46 via the toothed wheel 47. The shaft 46 rotatably drives, on the one hand, the disc 50 which reciprocates the chassis 1 between two extreme positions and, on the other hand, the filter disc 16 via the bevel gear 44, 45. Starting and stopping of the motor 49 is controlled by a stationary printed circuit 57 and a sliding contact 58 fixed on the disc 50 and arranged to set up selective electric contacts with the printed circuit 57. It can also be seen in FIGS. 3 and 4 that an opening 59 is provided in the lower wall 37 of chassis 1 to permit passage of the periphery of the filter disc 16, so that rotation of this disc can be controlled.

On the lower wall 37 of chassis 1 is mounted a tube-support in the form of an L-shaped bracket 60 having a setting screw 61 enabling this bracket to be moved forwards or backwards on the chassis 1. On bracket 60 is mounted the discharge tube 13 which in the illustrated embodiments is an annular Xenon tube. At the centre of tube 13, the bracket 60 also carries a setting lamp 14. At the centre of the intermediate wall 38, between the filter disc 16 and the tube 13 and lamp 14, is the diaphragm 15 having an actuating rod 62. As shown in FIG. 4, a beam of light 63 emitted by the lamp 14 passes through the diaphragm 15 (regulation of the opening of which will be explained later), through one of the filters of disc 16 and an opening 64 in the front wall 35 of chassis 1, to the optical condenser 10. On its upper wall 36, chassis 1 also has an opening 65 disposed above the tube 13 for the outlet of air heated by the tube 13.

Persons skilled in the art will easily understand that the possibility of moving the tubes 13 away from or towards the diaphragm 15 by means of the setting screw 61 of bracket 60 enables a constant luminous intensity to be obtained at any point of the plane of the film in the camera. This regulation of the luminous intensity to be constant at all points of the film will be explained in detail later. Also, it can be seen from FIG. 4 that the arrangement of the motor 49, the filter disc 16 and its driving members, and the driving disc 50 and its driving members can be adjusted so that when each of the filters and the sighting aperture of disc 16 is facing the diaphragm 15, the position of the light-generator chassis 1 on the guide rails is such that the chromatic aberration represented in FIG. 2 is compensated, i.e. the points $P_R$, $P_V$ and $P_B$ are brought to the same point corresponding approximately to the position of point $P_V$. Hence, the chassis 1 (FIGS. 1, 2 and 4) will be in an intermediate position when the green filter or the sighting aperture is facing the diaphragm 15, in a forward position (relative to the direction of the light beam) when the red filter is facing the diaphragm 15 and in a rear position when the blue filter is facing the diaphragm 15.

Figure 6:
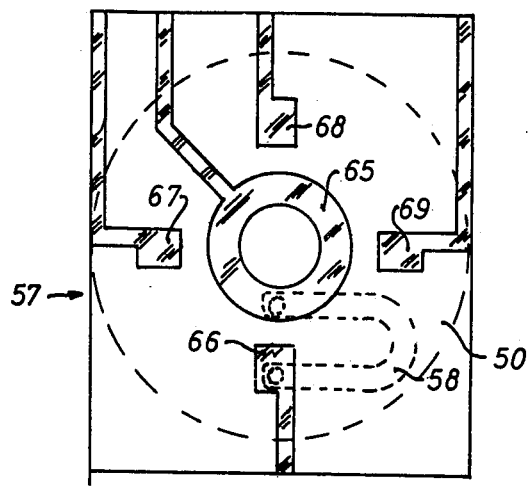
FIG. 6 is an enlarged-scale view of a printed circuit located under the sliding chassis of FIG. 3.

Control of displacement of the chassis 1 will now be explained in detail with reference to FIGS. 5 and 6. These figures show the disc 50 and the sliding contact 58 which makes a selective electric contact between a central circular electrically conductive area 65 and outer electrically conductive contact area 66, 67, 68 and 69 of the printed circuit 57. The areas 66, 67, 68 and 69 are connected (FIG. 5) to corresponding terminals 66a, 67a, 68a and 69a of a control switch 70. The area 66 and its terminal 66a correspond to an intermediate position of chassis 1, i.e. to setting for white light through the sighting aperture of the filter disc 16. The area 67 and its terminal 67a correspond to an extreme rear position of chassis 1, namely a setting for blue light when the disc 16 places the blue filter in the light beam. Area 68 and its terminal 68a correspond to another intermediate position of chassis 1, namely a setting for green light when the disc 16 places the green filter in the light beam. Area 69 and its terminal 69a correspond to the extreme forward position of chassis 1, namely a setting for red light, when the disc 16 is positioned to place the red filter in the light beam. The supply circuit of motor 49 shown by terminals 71 and 72 (FIG. 5) is connected to positive and negative supply terminals 73, 74 via a relay 75 having a winding 76 which is energized when the sliding contact 58 contacts one of the areas 66 to 69. The switch 70 is connected to the positive terminal 73.

The control circuit of FIGS. 5 and 6 operates as follows:

Suppose that the switch 70 is on terminal 66a, as indicated by the unbroken arrow, i.e. corresponding to the sighting position (white light), in which the beam of light passes through the sighting aperture of the filter disc 16. The chassis 1 is in one of its intermediate positions corresponding to the setting for white light (sighting). All of the settings of the optical bench of FIG. 1 (placing of an original in support 17; setting the position of support 17 on rails 2, 3, setting of the camera, etc.) are carried out by the operator. These settings are the same as for known installations, and will consequently not be described in detail.

Once the settings have been made, it is possible to proceed with taking of the colour selections. For this, the switch 70 is firstly placed onto the terminal 67a, as indicated by the dashed arrow in FIG. 5, which corresponding to taking of the blue selection. When the switch 70 leaves terminal 66a, to go towards terminal 67a, the energization circuit of winding 76 is cut off and the blade 75a of the relay moves up. Motor 49 starts up and drives the disc 50 clockwise (looking at FIG. 5). This turning of disc 50 drives the chassis 1 towards its rear limiting position corresponding to the predetermined setting for blue light. At the moment when the sliding contact 58 turning with disc 50 arrives on the area 67, as indicated by the broken arrow in FIG. 5, the winding 76 is re-energized and pulls the blade 75a down, thus switching off the motor 49. The disc 50 thus stops with the chassis 1 in its rear limiting position in which the blue selection is taken according to a well-known procedure. To pass to the following selection, the green selection, the switch 70 is placed onto terminal 68a. The motor 49 starts and the chassis 1 is brought to its second intermediate position corresponding to the setting for a green selection, for which the point of convergence of the beam of green light into the camera is exactly at the centre of the objective 21 (FIG. 1). Then, for the red selection, the chassis 1 is brought to its extreme forward position, by placing the switch 70 on terminal 69a. FIG. 6 shows that the conductive areas 66, 67, 68 and 69 are disposed at 90° to one another about the disc 50, the areas 67 and 69 corresponding to the two extreme positions of chassis 1 for blue and red selections, while the areas 66 and 68 provide approximately the same position of chassis 1 for sighting (no filter) and for green selection. The positions of chassis 1 thus depend on the angular positions of the conductive areas 66 to 69 on the disc 50. The positions of chassis 1 also depend on the position occupied by the camera 22 (FIG. 1). Persons skilled in the art will understand that if the elements of the bench of FIG. 1, i.e. condenser 10, the support 17, and the objective 21 of camera 22 were moved towards the right to occupy only the right hand half of the guide rails 2, 3, the corrections of chromatic aberration provided with the printed circuit of FIG. 6 would not be satisfactory. Thus, the printed circuit of FIG. 6 gives good results for an arrangement of the elements of the bench substantially as shown in FIG. 1, i.e. as long as the camera 22 is positioned only between the end cross-piece 5 and the objective-support 24 (FIG. 1) and the positions of the objective 21, the original-support 17 and condenser 10 do not vary greatly from the positions shown. If other positions are previewed, different printed circuits will be provided, the conductive areas of these circuits having different angular positions to those of the circuit of FIG. 6 as a function of the use of the bench.

Figure 5:
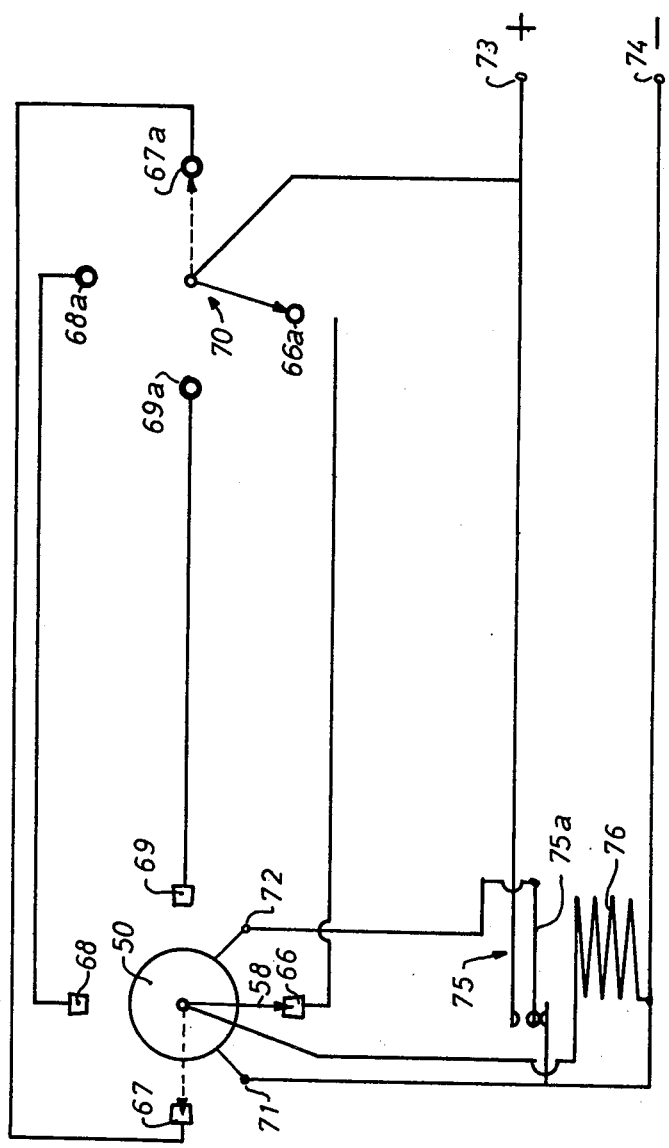
FIG. 5 is a diagram of an electric circuit for controlling movement of the chassis of FIGS. 3 and 4.

Of course, the system for controlling the movement of the chassis 1, i.e. the motor and associated driving members as well as the circuit of FIG. 5, may be replaced by a more elaborate system. One may for example provide a stepping motor controlled by a memory storing correction data corresponding to predetermined positions of the elements 1, 10, 17, 21 and 22 on the bench of FIG. 1.

As mentioned above, the procedure for taking colour selections using the described bench is the same as for conventional benches including, when the originals are of poor quality, masking operations. However, the quality of selections obtained with corrrection of chromatic aberrations by displacement of the light-generator chassis 1 is such that masking is not usually necessary. All of the setting operations are in general carried out using the lamp 14 (FIGS. 1 and 4) and the taking of selections is carried out using the Xenon tube 13. As mentioned above, a setting can be carried out to make the light intensity equal for each point of the film. This setting is carried out in the following manner:

A light beam emitted by an annular tube such as tube 13 gives, in projection in a plane perpendicular to the axis of the beam, a distribution of light in the form of a circle in which the luminous intensity is greater at the edges of the circle than at its centre. By moving the tube 13 in the chassis 1 by means of the bracket 60 and setting screw 61 (FIG. 4), it is possible to obtain, for a given opening of the diaphragm 15, an equal distribution of the light in the plane of the film of camera 22, i.e. with the luminous intensity equal for each point of the film surface. If the camera 22 is of the type described in the aforesaid Swiss Pat. No. 575 610 and U.S. Pat. No. 3,984,849, this regulation of the intensity is easy to make. Once the opening of the diaphragm 15 is chosen, it suffices to make several light-intensity measurements by means of the aforementioned photo-electric cell 100 in several different positions of the image surface at the image 101, and to find the position of bracket 60 for which these measurements are approximately the same as the centre and at the edges of the image.

The optical bench of FIG. 1 can be used to obtain perfectly sharp selctions, or selections with a desired blurring effect. For this purpose, in front of the outlet of the diaphragm 15 of chassis 1, is placed an unpolished glass 104, acting as a light diffuser. The camera objective 21 also has a diaphragm 106. If the diaphragm 15 of chassis 1 is closed and the diaphragm 106 of the objective 21 opened while taking care to carry out the setting of the light intensity by moving the support 60 (FIG. 4) and making measurements of the intensity at several points of the image surface by means of the camera cell 100, selections of exceptional sharpness and hardness (contrast) will be obtained. To the contrary, to obtain blurred effects, it suffices to open the diaphragm 15 and close the diaphragm 106 of the objective 21. Of course, the operator can select any intermediate settings between the complete closure and opening of the two diaphragms.

Figure 7:
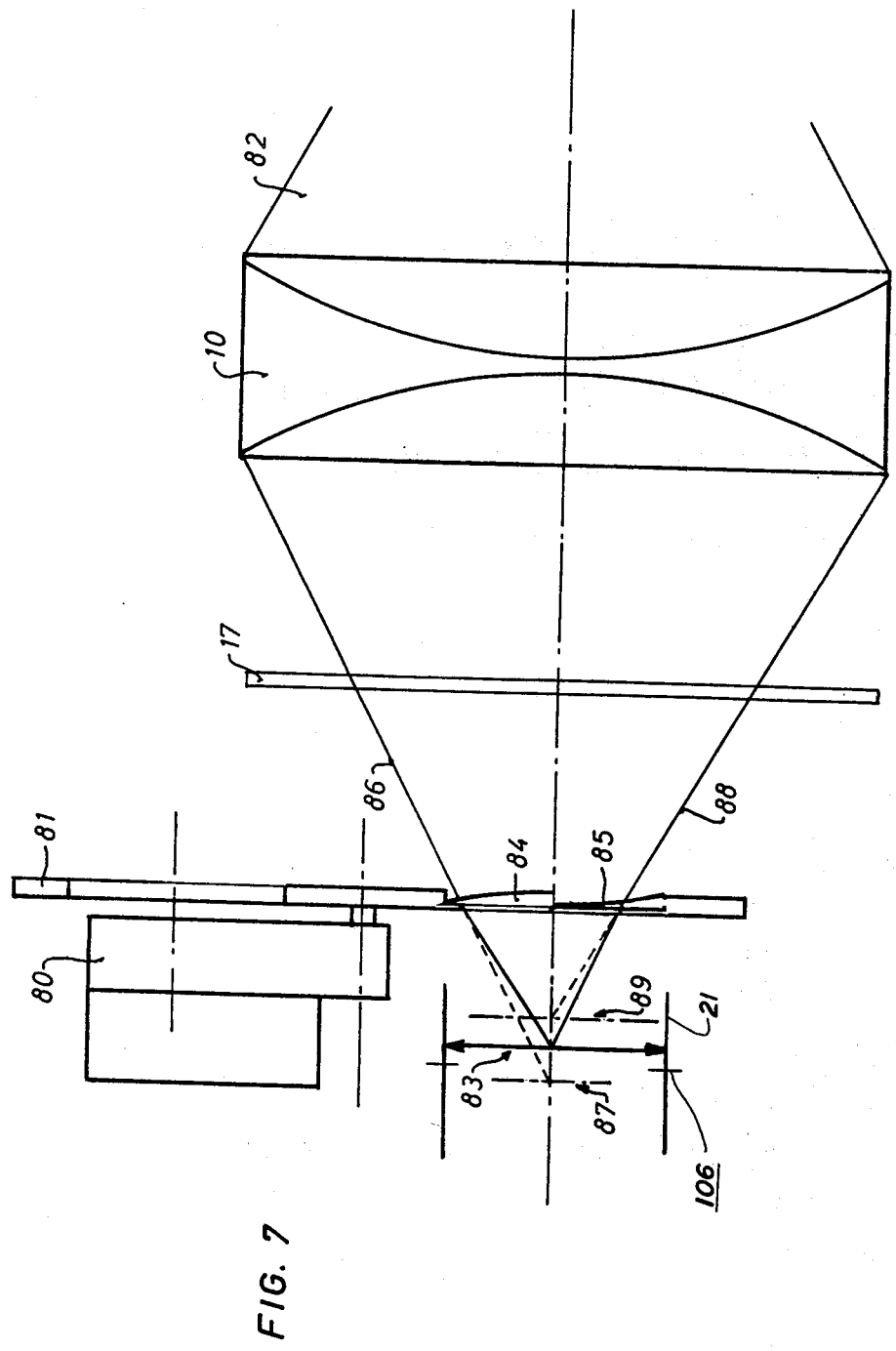
FIG. 7 is a view of a first variation of a part of the unit of FIG. 1.

FIG. 7 shows a variation of part of the optical bench of FIG. 1 in which the correction of chromatic aberration is no longer achieved by displacing the light-generator chassis, but by adding correcting lenses between the objective 21 of camera 22 and the original-support 17. In this variation, the chassis 1 is fixed on the guide rails 2, 3. The motor 16' is used only to turn the filter disc 16. The motor 16' is coupled by means not shown to a motor 80 carrying on its shaft a disc 81 placed between the objective 21 and the original-support 17. Thus, the beam of light 82 from the light-generator passes through the condenser 10 and an original carried by support 17 into the objective 21 whose centre is represented by line 83. The disc 81 has two openings as well as a converging lens 84 and a diverging lens 85. These are disposed on the disc 81 so that the beam 82 passes through (a) an opening of disc 81 when the sighting aperture or the green filter of disc 16 is placed in the beam, (b) the converging lens 84 when the red filter of disc 16 is in the beam, and (c) the diverging lens 85 when the blue filter of disc 16 is in the beam.

As already explained, regulation for the green beam corresponds approximately to regulation for the beam of white light. Thus, it is not necessary to make a correction for the green selection when the setting is carried out with white light. Hence, when the green filter of disc 16 is in place, the filter 81, whose angular position is coupled with that of the filter disc 16, will allow the beam to pass through an opening and converge to line 83 (centre of the objective 21). When the red filter of disc 16 is in the beam, the disc 81 places its converging lens 84 in the beam to bring the line 86 (whose point of convergence is situated on a line 87 beyond the centre of the objective) onto the centre of the objective. When the blue filter of disc 16 is in the beam, the diverging lens 85 of disc 81 brings the line 88 (whose point of convergence is on a line 89 in front of the centre of the objective 21) onto the centre of the objective 21.

Of course, in the just-described variation, the converging and diverging lenses must be very precisely made and must be precisely placed in the light beam, in order not to distort or displace the image projected onto the film in the camera.

Figure 8:
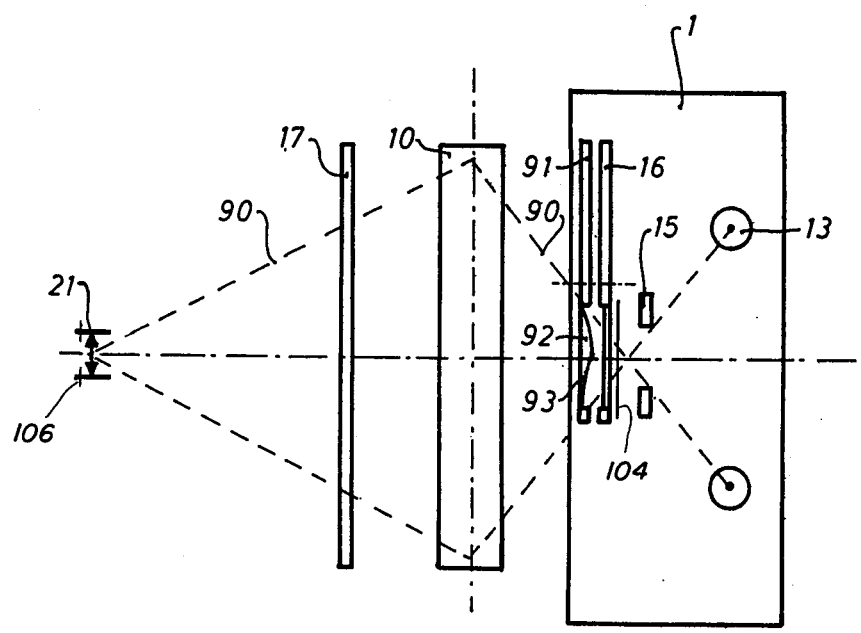
FIG. 8 is a view of a second variation of a part of the unit of FIG. 1.

In order to considerably reduce the very high precision requirements for the positioning of the lenses 84, 85 of the variation of FIG. 7, it is possible, as shown in FIG. 8 for the second variation, to place the correction lenses in the light beam not between the camera and the original-support, but between the light source and the condenser 10. FIG. 8 shows the light-generator chassis 1 with its light source 13, diaphragm 15 and filter disc 16 enabling filters of different colours to be brought into the light beam 90 produced by source 13. As in the unit of FIG. 1, the light beam 90 passes through the optical condenser 10, then an original carried by the support 17 and enters the objective 21 of the still camera. A second disc 91 is placed adjacent the filter disc 16, between the latter and the condenser 10.

The disc 91 has two openings as well as a converging lens 92 and a diverging lens 93. As in the first variation of FIG. 7, the two openings and the two lenses 92, 93 are disposed on the disc 91 so that the beam 90 passes through (a) an opening when the sighting aperture or the green filter of disc 16 is in place, (b) the converging lens 92 when the red filter of disc 16 is in the beam and (c) the diverging lens 93 when the blue filter of disc 16 is in place. Thus, with the disc 91 it is possible to correct the point of convergence of the blue and red beams, so that this point of convergence coincides with the centre of objective 21 for the three selections, red, green and blue. Also, as the disc 91 is placed before the condenser 10 and the original-support 17, the precision with which the lenses 92 and 93 must be placed in the light beam is less critical than for the variation of FIG. 7.

Instead of mounting the lenses 92, 93 on a separate disc 91 turning with the disc 16, they can alternatively be carried by the disc 16 with the red and blue filters.

In the embodiment of FIGS. 1 to 6 and the variations of FIGS. 7 and 8, the light-generator chassis has a filter disc with three filters: red, green and blue. Of course, the disc may comprise supplementary filters, for example an orange filter, an olive filter or grey filters. When supplementary filters are provided, additional positions will be provided on the control switch 70 of FIG. 5 and on the printed circuit of FIG. 6. As a variation, a supplementary disc carrying for example an orange filter or grey filters could be placed parallel to and adjacent disc 16.

As previously mentioned, to permit the reproduction of large originals, the optical condenser must have a focal length of about 400 mm. The condenser 10 is thus formed of two large lenses. However, such a condenser weighs several tens of kilograms and is consequently expensive, and also has the disadvantage of producing a spherical aberration. Against the established usages, the applicant has carried out tests with a condenser formed of two Fresnel lenses. Such a condenser has the advantage of low weight, relatively low cost and the production of relatively little spherical aberration. Its principal disadvantage is the formation of dark concentric rings. However, the applicant has remarked that excellent results can be obtained with a condenser formed of Fresnel lenses provided the original-support is spaced from the camera objective by a distance greater than the focal length of the objective. If this condition is satisfied, no Fresnel ring is visible on the colour selections. Thus, means may be provided for preventing movement of the original-support closer to the camera objective than the focal point of the objective. As the focal length of the objective is short (about 80 to 100 mm) compared to that of the condenser (about 400 mm), the mentioned condition for avoiding the formation of rings does not place any limitation to the use of the unit of FIG. 1.

What is claimed is:

1. A unit for reproducing transparent originals, or the like, comprising:
   a light generator for producing a beam of light; said light generator comprising a light source;
   a camera having a film plane; a condenser for directing light to the film plane of said camera;
   a carrier for supporting an original in the beam of light from said light source;
   said light source being shaped in the annular form, with said annular source having an axis directed toward said camera objective and said light source directing light from said light generator toward the film plane in said camera;
   said light source being movably mounted in said unit for enabling shifting of said light source toward and away from said objective, for permitting compensating of the loss of luminosity at the edges of the image due to vignetting of the camera objective and for obtaining also uniform light intensity on the film plane in the camera.

2. The unit according to claim 1, wherein said annular source is a tubular lamp.

3. The unit according to claim 2, wherein said tubular lamp is a discharge tube.

4. The unit according to claim 1, wherein said light generator further comprises a second light source located at the center of said annular light source and directing light toward said camera objective.

5. The unit according to claim 1, wherein said light generator includes an outlet for light; an adjustable light generator diaphragm placed so that the light from said light source to said object passes through said light generator diaphragm.

6. The unit according to claim 5, further comprising filter means placed near to said light generator diaphragm.

7. The unit according to claim 6, wherein said filter means is placed in front of said light generator diaphragm and between said light generator diaphragm and said objective.

8. The unit according to claim 5, further comprising an adjustable objective diaphragm near said camera objective; said light generator diaphragm and said objective diaphragm being independently adjustable.

9. The unit according to either of claims 5, 6, 7, or 8, further comprising a diffusing element placed in front of said light generator diaphragm and between said light generator diaphragm and said objective.

10. The unit according to claim 1, further comprising light intensity measuring means in said camera for measuring light intensity at various locations at the film plane.

* * * * *